(12) United States Patent
Kim et al.

(10) Patent No.: US 8,946,004 B2
(45) Date of Patent: Feb. 3, 2015

(54) CONTACT PORTION OF WIRE AND MANUFACTURING METHOD THEREOF

(75) Inventors: Joo-Han Kim, Yongin-si (KR); Ki-Yong Song, Seoul (KR); Dong-Ju Yang, Seoul (KR); Hee-Joon Kim, Cheonan-si (KR); Yeo-Geon Yoon, Seoul (KR); Sung-Hen Cho, Seoul (KR); Chang-Hoon Kim, Cheonan-si (KR); Jae-Hong Kim, Seoul (KR); Yu-Gwang Jeong, Yongin-si (KR); Ki-Yeup Lee, Seoul (KR); Sang-Gab Kim, Seoul (KR); Yun-Jong Yeo, Seoul (KR); Shin-Il Choi, Seoul (KR); Ji-Young Park, Suwon-si (KR)

(73) Assignee: Samsung Display Co., Ltd. (KR)

( * ) Notice: Subject to any disclaimer, the term of this patent is extended or adjusted under 35 U.S.C. 154(b) by 1294 days.

(21) Appl. No.: 12/544,144

(22) Filed: Aug. 19, 2009

(65) Prior Publication Data

US 2010/0230679 A1 Sep. 16, 2010

(30) Foreign Application Priority Data

Mar. 13, 2009 (KR) .................. 10-2009-0021476

(51) Int. Cl.
*H01L 29/786* (2006.01)
*H01L 27/12* (2006.01)
*G02F 1/1362* (2006.01)

(52) U.S. Cl.
CPC ...... *H01L 27/1214* (2013.01); *G02F 1/136227* (2013.01); *H01L 27/12* (2013.01)

USPC ..... 438/149; 438/151; 438/609; 257/E29.291

(58) Field of Classification Search
USPC .................. 257/E29.291; 438/609, 151, 149
See application file for complete search history.

(56) References Cited

U.S. PATENT DOCUMENTS

| 6,960,519 | B1 * | 11/2005 | Dalton et al. | 438/617 |
| 7,061,015 | B2 * | 6/2006 | Kim et al. | 257/59 |
| 2005/0110019 | A1 * | 5/2005 | Ryu et al. | 257/72 |
| 2007/0082434 | A1 * | 4/2007 | Bae et al. | 438/149 |
| 2007/0190717 | A1 * | 8/2007 | Kim | 438/244 |
| 2008/0231779 | A1 * | 9/2008 | Shin et al. | 349/106 |

\* cited by examiner

*Primary Examiner* — Michael Jung
*Assistant Examiner* — John P Dulka
(74) *Attorney, Agent, or Firm* — Innovation Counsel LLP

(57) ABSTRACT

A contact portion of wiring and a method of manufacturing the same are disclosed. A contact portion of wiring according to an embodiment includes: a substrate; a conductive layer disposed on the substrate; an interlayer insulating layer disposed on the conductive layer and having a contact hole; a metal layer disposed on the conductive layer and filling the contact hole; and a transparent electrode disposed on the interlayer insulating layer and connected to the metal layer, wherein the interlayer insulating layer includes a lower insulating layer and an upper insulating layer disposed on the lower insulating layer, the lower insulating layer is undercut at the contact hole, and the metal layer fills in the portion where the lower insulating layer is undercut.

18 Claims, 19 Drawing Sheets

CONTACT PORTION OF WIRE AND MANUFACTURING METHOD THEREOF

CROSS-REFERENCE TO RELATED APPLICATIONS

This application claims priority to and the benefit of Korean Patent Application No. 10-2009-0021476 filed in the Korean Intellectual Property Office on Mar. 13, 2009, the entire contents of which are incorporated herein by reference.

BACKGROUND

1. Technical Field

The present invention generally relates to a contact portion of wiring and a method of manufacturing the contact portion of wiring and, more particularly, to a thin film transistor array panel including the contact portion of wiring and a method of manufacturing the thin film transistor array panel including the contact portion of wiring.

2. Related Art

Generally, it is preferable that an area of a semiconductor element is optimized and that wiring thereof is formed with a multi-layered structure as the semiconductor element is highly integrated. To minimize the interference of a signal transmitted through the wiring, an insulating layer is preferably made of a material having a low dielectric constant, and wires that transmit the same signal are connected to each other through a contact hole of the insulating layer. When etching the insulating layer to form the contact hole, if an undercut is generated at the contact portion, step coverage of the contact portion may be degraded. The profile of the wiring formed on the insulating layer may, thus, deteriorate, and disconnection of the wiring may occur at the contact portion.

Such wiring may be useful, for example, for a liquid crystal display (LCD). The liquid crystal display is one of the most commonly used types of flat panel displays. An LCD typically includes two substrates with electrodes formed thereon and a liquid crystal layer interposed between the two substrates. In the LCD, a voltage is applied to the electrodes to realign liquid crystal molecules of the liquid crystal layer to thereby regulate the transmittance of light passing through the liquid crystal layer.

Among liquid crystal displays, a liquid crystal display having a structure in which field generating electrodes are respectively formed on two display panels and having a thin film transistor for switching voltages applied to the field generating electrodes is widely used. Generally, the panel having the thin film transistor includes wiring including a gate line transmitting a scanning signal and a data line transmitting an image signal, and a gate pad and a data pad receiving the scanning signal or the image signal from an external circuit and transmitting the signals to the gate line and the data line. A pixel electrode electrically connected to the thin film transistor is formed in a pixel area defined by an intersection of the gate line and the data line.

In order to improve the display characteristics of the liquid crystal display, it is important to obtain a sufficient aperture ratio of the pixel. For this object, the wiring and the pixel electrode overlap each other, and an insulating layer made of an organic material having a low dielectric ratio to minimize the signal transmitted through the wiring is formed therebetween.

In manufacturing the thin film transistor array panel for the liquid crystal display, it usually is necessary to expose the wiring for connection to the pad for receiving the signal from the external circuit or for connecting the wires to each other.

When forming the contact hole at the lower layer, however, by etching the lower layer using the insulating layer having the contact hole as an etch mask, if the contact hole exposing the pad or the wiring is formed in the condition that the insulating layer is not etched to secure (e.g., preserve) the thickness of the insulating layer, the lower layer typically is severely undercut under the insulating layer such that the step coverage of the contact portion deteriorates. Accordingly, the profile of the other, upper layer may be degraded, or the upper layer may be disconnected at the contact portion.

The above information disclosed in this Background section is only for enhancement of understanding of the background of the invention, and therefore it may contain information that does not form the prior art that is already known in this country to a person of ordinary skill in the art.

SUMMARY

Embodiments of the present invention generally provide a contact portion of wiring and a method for manufacturing the same for a liquid crystal display having a high resolution and a high aperture ratio.

A contact portion of wiring according to an embodiment of the present invention includes: a substrate; a conductive layer disposed on the substrate; an interlayer insulating layer disposed on the conductive layer and having a contact hole wherein the interlayer insulating layer includes a lower insulating layer and an upper insulating layer disposed on the lower insulating layer, the lower insulating layer is undercut at the contact hole; a metal layer disposed on the conductive layer and filling the contact hole; and a transparent electrode disposed on the interlayer insulating layer and connected to the metal layer, wherein the metal layer fills in the portion of the contact hole where the lower insulating layer is undercut.

The metal layer may be formed through electroless plating. The upper insulating layer may be made of a photosensitive organic insulator, and the lower insulating layer may be made of an inorganic insulator. The side surface of the upper insulating layer forming the side wall of the contact hole may be perpendicular to the surface of the substrate. The side surface of the upper insulating layer forming the side wall of the contact hole may have a reverse taper with respect to the surface of the substrate.

A method for manufacturing a contact portion of a wiring according to another embodiment of the present invention includes: forming a conductive layer on a substrate; sequentially forming a lower insulating layer and an upper insulating layer on the conductive layer; patterning the upper insulating layer to form a primary contact hole exposing the lower insulating layer; etching the lower insulating layer by using the patterned upper insulating layer as a mask to form a contact hole exposing the conductive layer; forming a metal layer inside the contact hole through electroless plating; and forming a transparent electrode connected to the metal layer on the upper insulating layer.

The upper insulating layer may be made of a photosensitive organic insulator, and the lower insulating layer may be made of an inorganic insulator. The contact hole may include a portion where the lower insulating layer is undercut under the upper insulating layer, and the portion where the lower insulating layer is undercut may be filled in with the metal layer in the forming of the metal layer. The side wall of the primary contact hole may be perpendicular to the surface of the substrate in the forming of the primary contact hole.

A thin film transistor array panel according to another embodiment of the present invention includes: a substrate; a gate wire disposed on the substrate and including a gate line and a gate electrode connected to the gate line; a gate insulating layer covering the gate wire; a semiconductor layer disposed on the gate insulating layer; a data wire disposed on the gate insulating layer and the semiconductor layer and including a data line, a source electrode connected to the data line and neighboring the gate electrode, and a drain electrode facing the source electrode with respect to the gate electrode; an interlayer insulating layer disposed on the data wire and having a first contact hole exposing the drain electrode; a first metal layer disposed in the first contact hole and connected to the drain electrode; and a pixel electrode disposed on the interlayer insulating layer and connected to the first metal layer, wherein the interlayer insulating layer includes a lower insulating layer and an upper insulating layer disposed on the lower insulating layer, the lower insulating layer is undercut at the first contact hole, and, the first metal layer fills in the portion where the lower insulating layer is undercut.

The first metal layer may be formed through electroless plating. The upper insulating layer may be made of a photosensitive organic insulator, and the lower insulating layer may be made of an inorganic insulator. The upper insulating layer may be a color filter. The gate wire may further include a gate pad connected to one end of the gate line; the gate insulating layer may cover the gate pad; the interlayer insulating layer may be disposed on the gate insulating layer; a second metal layer may be disposed inside a second contact hole passing through the interlayer insulating layer and the gate insulating layer and connected to the gate pad; and a first contact assistant may be disposed on the interlayer insulating layer and connected to the second metal layer. The data wire may further include a data pad connected to one end of the data line wherein the interlayer insulating layer covers the data pad; a third metal layer may be disposed inside a third contact hole passing through the interlayer insulating layer and connected to the data pad; and a second contact assistant may be disposed on the interlayer insulating layer and connected to the third metal layer. The second metal layer and the third metal layer may be formed through electroless plating. The data line may cross and be insulated from the gate line; the interlayer insulating layer may cover the gate line and have a first groove exposing the upper surface of the gate line; a fourth metal layer may fill in the first groove and contact the gate line. The interlayer insulating layer may cover the data line and have a second groove exposing the upper surface of the data line, and a fifth metal layer may fill in the second groove and contact the data line. An overcoat may cover the fourth metal layer and the fifth metal layer on the interlayer insulating layer. The fourth metal layer and the fifth metal layer may be formed through electroless plating.

A method for manufacturing a thin film transistor array panel according to another embodiment of the present invention includes: forming a gate wire including a gate line, a gate electrode connected to the gate line, and a gate pad connected to one end of the gate line on a substrate; forming a gate insulating layer on the gate wire; forming a semiconductor layer on the gate insulating layer; forming a data wire intersecting and insulated from the gate line and including a data line, a source electrode connected to the data line and neighboring the gate electrode, a drain electrode facing the source electrode with respect to the gate electrode, and a data pad connected to one end of the data line; sequentially forming a lower insulating layer and an upper insulating layer on the data wire; patterning the upper insulating layer to form a first primary contact hole exposing the lower insulating layer; etching the lower insulating layer by using the patterned upper insulating layer as a mask to form a first contact hole exposing the drain electrode; forming a first metal layer through electroless plating inside the first contact hole; and forming a pixel electrode on the upper insulating layer and connected to the first metal layer.

The upper insulating layer may be made of a photosensitive organic insulator, and the lower insulating layer may be made of an inorganic insulator. The first contact hole may include a portion where the lower insulating layer is undercut under the upper insulating layer, and the first metal layer may be formed to fill in, in the forming of the first metal layer, the portion of the first contact hole where the lower insulating layer is undercut. The upper insulating layer may be a color filter. The side wall of the first primary contact hole may be perpendicular to the surface of the substrate in the forming of the first primary contact hole. A second primary contact hole and a third primary contact hole may be formed in the upper insulating layer together with the forming of the primary contact hole, and a second contact hole passing through the lower insulating layer and the gate insulating layer and exposing the gate pad and a third contact hole passing through the lower insulating layer and exposing the data pad may be formed together with the forming of the first contact hole. A second metal layer and a third metal layer may be respectively formed inside the second contact hole and the third contact hole together with the forming of the first metal layer. A first primary groove and a second primary groove may be formed in the upper insulating layer along with the forming of the first primary contact hole, and a first groove and a second groove respectively exposing the upper surface of the gate line and the upper surface of the data line may be formed along with the forming of the first contact hole. A fourth metal layer contacting the gate line inside the first groove and a fifth metal layer contacting the data line inside the second groove may be formed along with the forming of the first metal layer.

According to one or more embodiments of the present invention, a metal layer is filled through electroless plating in the portion of a contact hole where an undercut is generated such that the wiring may be prevented from being disconnected in the contact portion. Also, when defects of the gate line and the data line are generated, the defects may be resolved through the metal layer formed through electroless plating.

DETAILED DESCRIPTION

Figure 1:
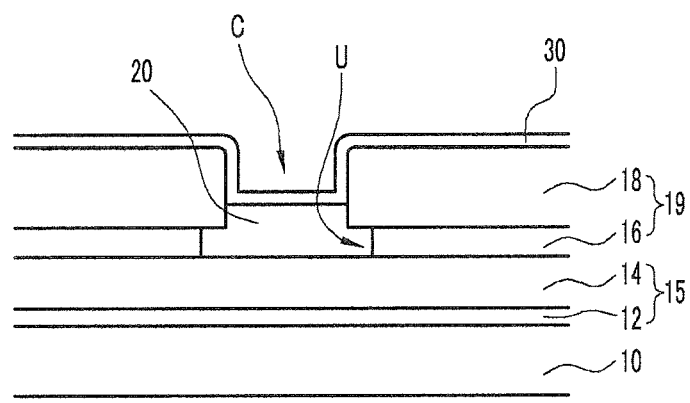
FIG. 1 is a cross-sectional view illustrating a contact portion of wiring according to an embodiment of the present invention.

Embodiments of the present invention will be described more fully hereinafter with reference to the accompanying drawings, in which embodiments of the invention are shown. However, it is to be understood that the invention is not limited to the disclosed embodiments, but, on the contrary, is intended to cover various modifications. As those skilled in the art would realize, the described embodiments may be modified in various different ways, all without departing from the spirit or scope of the present invention.

In the drawings, the thickness of layers, films, panels, regions, etc., may be exaggerated for clarity. It will be understood that when an element such as a layer, film, region, or substrate is referred to as being "on" another element, it can be directly on the other element or intervening elements may also be present. Like reference numerals designate like elements throughout the specification.

FIG. 1 is a cross-sectional view for explaining a contact portion of a wiring according to an embodiment of the present invention. Referring to FIG. 1, a conductive layer 15 is disposed on an insulation substrate 10 made of glass or plastic. The conductive layer 15 may include a first conductive layer 12 and a second conductive layer 14.

The wiring for transmitting signals may include a conductive layer 15 having low resistivity—such as aluminum or an aluminum alloy—to minimize the delay. The wiring may be connected to a metal layer 20 for receiving signals from an external circuit, or transmitting signals to an external circuit, and may have low contact resistance in the contact portion when in contact with another conductive material. In particular, when using IZO as a transparent conductive layer 30 for a liquid crystal display, the contact resistance between the IZO and the aluminum or aluminum alloy may be high such that design of the contact portion may be required to minimize the contact resistance of the contact portion where the IZO is connected to the wiring that includes aluminum.

The first conductive layer 12 may be made of a metal having low resistivity to reduce a voltage drop—such as an aluminum-containing metal, a silver-containing metal, or a copper-containing metal. The second conductive layer 14 may be made of a material having excellent physical, chemical, and electrical contact characteristics with another layer— such as a molybdenum-containing metal, chromium, tantalum, or titanium. However, the material for forming the first conductive layer 12 and the second conductive layer 14 is not limited to the above-described materials, and the first conductive layer 12 may be made of the molybdenum-containing metal, chromium, tantalum, or titanium and the second conductive layer 14 may be made of the aluminum-containing metal, the silver-containing metal, or the copper-containing metal. The conductive layer 15 may be made of a plurality of layers of molybdenum/aluminum/molybdenum, a multilayer structure of more than three layers, or a single layered structure, for example, in alternative embodiments of the present invention.

An interlayer insulating layer 19 including a contact hole C is disposed on the conductive layer 15. The interlayer insulating layer 19 includes a lower insulating layer 16 and an upper insulating layer 18 disposed on the lower insulating layer 16. The contact hole C passing through the lower insulating layer 16 is wider than the contact hole C passing through the upper insulating layer 18. That is, the lower insulating layer 16 is undercut at the contact hole C.

The side surface of the upper insulating layer 18 forming the side wall of the contact hole C is almost perpendicular with respect to the surface of the insulation substrate 10. The profile of the side surface of the upper insulating layer 18 may be realized by forming the upper insulating layer 18 using an organic layer having high thermal resistance. The profile of the side surface of the upper insulating layer 18 is vertical such that a metal layer 20 filled in the contact hole C may have a high height and a narrow width.

The lower insulating layer 16 may be made of an inorganic insulator such as silicon nitride or silicon oxide. The upper insulating layer 18 may be made of an organic insulator. Also, the upper insulating layer 18 may be made of an organic insulator having photosensitivity.

A metal layer 20 is formed in the contact hole C on the conductive layer 15. The metal layer 20 may be formed by using electroless plating. The metal layer 20 may be filled in the portion U where the lower insulating layer 16 is undercut. The metal layer 20 may be made of a metal such as Ni, Co, Cu, Zn, Ag, Pt, or Pd.

A transparent electrode 30 is formed on the interlayer insulating layer 19. The transparent electrode 30 is connected to the metal layer 20 through the contact hole C. The transparent electrode 30 may be made of indium tin oxide (ITO) or indium zinc oxide (IZO).

The metal layer 20 may completely fill in the contact hole C. Also, the metal layer 20 may be formed higher than the upper surface of the interlayer insulating layer 19.

Figure 2:
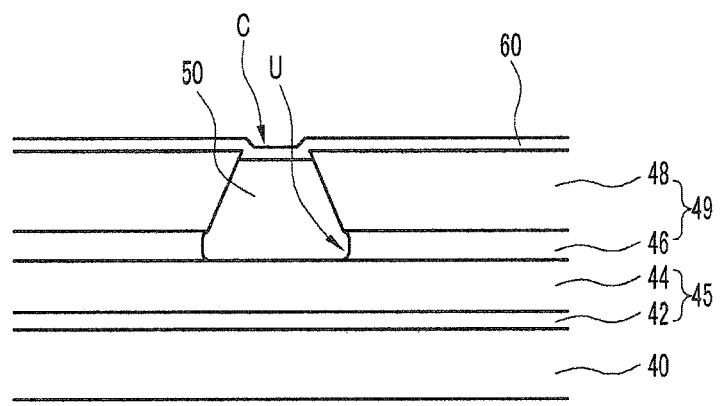
FIG. 2 is a cross-sectional view illustrating a contact portion of wiring according to another embodiment of the present invention.

FIG. 2 is a cross-sectional view for explaining a contact portion of wiring according to another embodiment of the present invention. Referring to FIG. 2, most components of the contact portion of the wiring are the same as that of the embodiment shown in FIG. 1. A conductive layer 45 is formed on an insulation substrate 40. The conductive layer 45 may include a first conductive layer 42 and a second conductive layer 44. An interlayer insulating layer 49 having a contact hole C is disposed on the conductive layer 45. The interlayer insulating layer 49 includes a lower insulating layer 46 and an upper insulating layer 48 disposed on the lower insulating layer 46. The lower insulating layer 46 is undercut (indicated by U) at the contact hole C.

In the embodiment of FIG. 2, however, the side surface of the upper insulating layer 48 forming the side wall of the contact hole C has a reverse taper structure with respect to the surface of the insulation substrate 40. A metal layer 50 is formed in the contact hole C on the conductive layer 45. The metal layer 50 may fill in the contact hole C through the use of electroless plating for a configuration in which the side surface of the upper insulating layer 48 is reverse-tapered and the lower insulating layer 46 has an undercut U. A transparent electrode 60 is disposed on the interlayer insulating layer 49.

Figure 3:
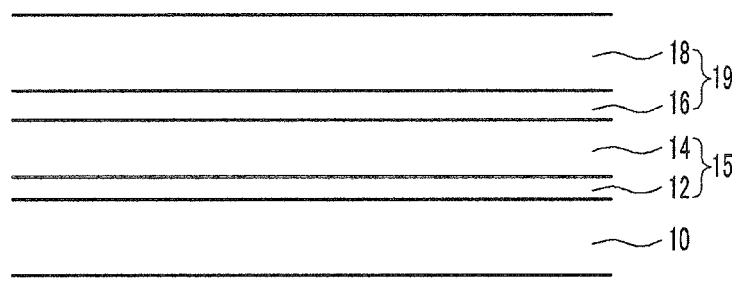
FIG. 3 to FIG. 6 are cross-sectional views illustrating a method, according to one or more embodiments, for manufacturing the contact portion of the wiring shown in FIG. 1.

FIG. 3 to FIG. 6 are cross-sectional views for explaining a manufacturing method, in accordance with one or more embodiments, of the contact portion of the wiring shown in FIG. 1. Referring to FIG. 3, the conductive layer 15 is formed on the insulation substrate 10. The conductive layer 15 may be formed through a deposition method such as sputtering. The conductive layer 15 may be formed by sequentially depositing the first conductive layer 12 and the second conductive layer 14.

The interlayer insulating layer 19 is formed on the conductive layer 15. The interlayer insulating layer 19 may be formed by sequentially depositing the lower insulating layer 16 and the upper insulating layer 18. The lower insulating layer 16 may be made of an inorganic insulator such as silicon nitride or silicon oxide, and the upper insulating layer 18 may be made of an organic insulator having photosensitivity. In particular, the upper insulating layer 18 may be made of an organic insulator having high thermal resistance.

Figure 4:
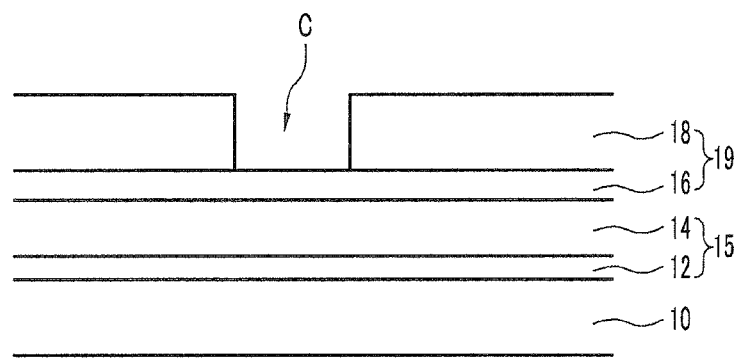

Referring to FIG. 4, the upper insulating layer 18 is patterned to form the primary contact hole C. A portion of the upper surface of the lower insulating layer 16 is exposed through the primary contact hole C. The side wall of the primary contact hole C may be approximately perpendicular to the surface of the insulation substrate 10. For example, the side surface of the upper insulating layer 18 forming the side wall of the primary contact hole C and the upper surface of the lower insulating layer 16 may form an angle of 80 to 90 degrees.

Figure 5:
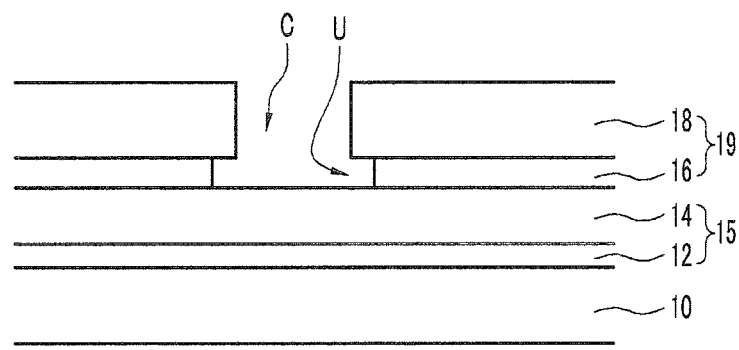

Referring to FIG. 5, the lower insulating layer 16 is etched using the upper insulating layer 18 as a mask to form the contact hole exposing the conductive layer 15. The contact hole passing through the lower insulating layer 16 is wider than the primary contact hole passing through the upper insulating layer 18. That is, the contact hole includes the portion U where the lower insulating layer 16 is undercut under the upper insulating layer 18.

Figure 6:
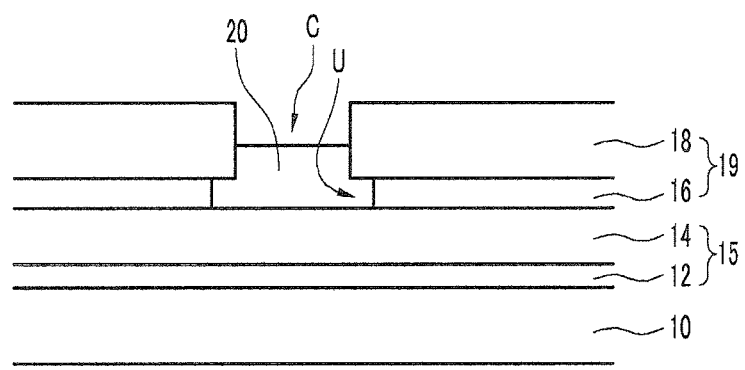

Referring to FIG. 6, the metal layer 20 is formed through electroless plating on the conductive layer 15 to fill in the contact hole. The portion U where the lower insulating layer 16 is undercut may be filled in by the metal layer 20. The metal layer 20 may fill in a portion of the contact hole, or may completely fill in the contact hole.

Although not shown, the upper insulating layer 18 may be subjected to thermal reflow before forming the metal layer 20 through electroless plating, thereby reducing defects due to the undercut U of the lower insulating layer 16.

A transparent electrode 30 (see FIG. 1) is formed on the interlayer insulating layer 19 through sputtering such that the metal layer 20 may be connected to the transparent electrode 30 through the contact hole C. Accordingly, the contact portion of the wiring according to the embodiment shown in FIG. 1 may be completed.

Figure 7:
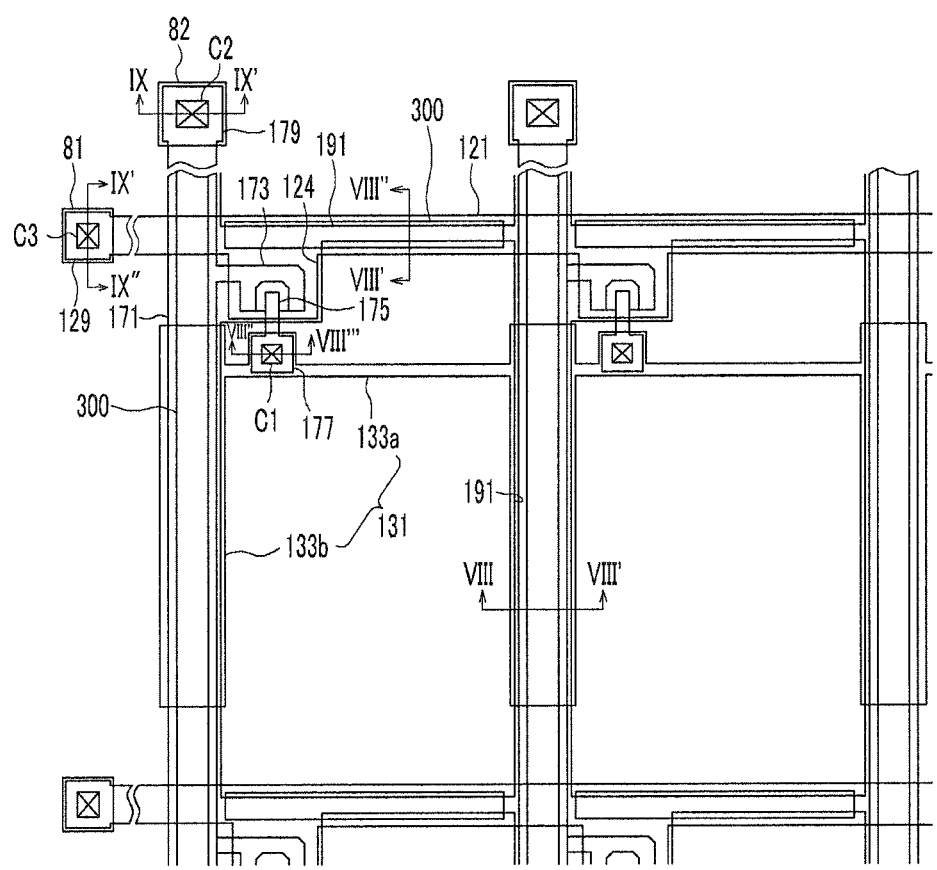
FIG. 7 is a layout view illustrating a thin film transistor array panel according to another embodiment of the present invention.
Figure 8:
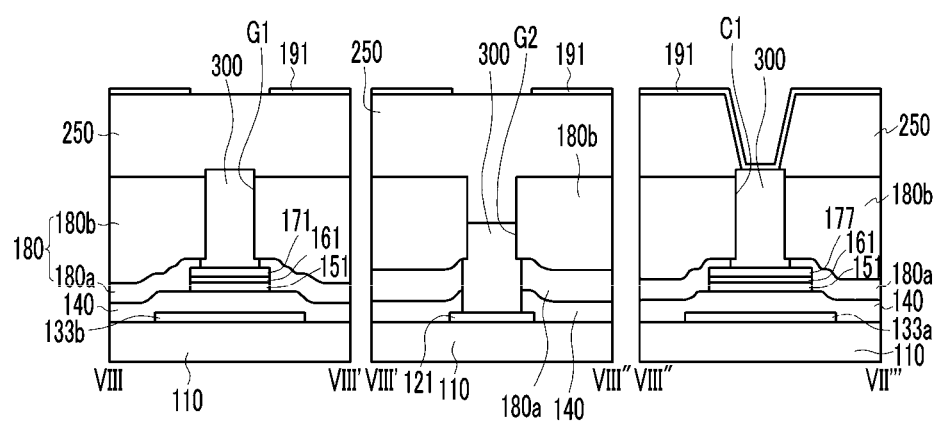
FIG. 8 is a cross-sectional view taken along the lines VIII-VIII', VIII'-VII'', and VIII''-VIII''' shown in FIG. 7, according to an embodiment.
Figure 9:
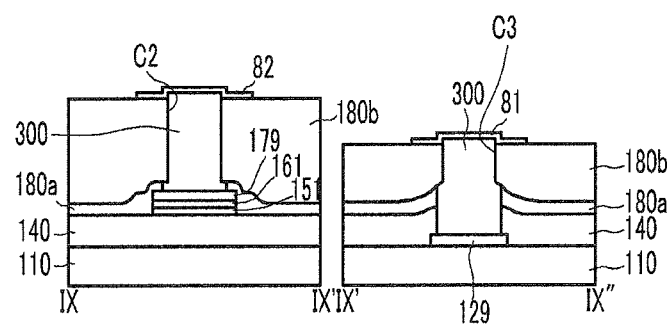
FIG. 9 is a cross-sectional view taken along the lines IX-IX' and IX'-IX'' shown in FIG. 7, according to an embodiment.

FIG. 7 is a layout view for explaining a thin film transistor array panel according to another embodiment of the present invention. FIG. 8 is a cross-sectional view taken along the lines VIII-VIII', VIII'-VIII", and VIII"-VIII'" shown in FIG. 7; and FIG. 9 is a cross-sectional view taken along the lines IX-IX', and IX'-IX" shown in FIG. 7 according to one or more embodiments. Referring to FIG. 7 and FIG. 8, a plurality of gate lines 121 and a plurality of storage electrode lines 131 are formed on an insulating substrate 110, which is preferably made of transparent glass or plastic.

The gate lines 121 extend substantially in a transverse direction and transmit gate signals. Each gate line 121 includes a plurality of gate electrodes 124 protruding upward and a gate pad 129 having a large area for connection with another layer or an external driving circuit.

A gate driving circuit (not shown) that generates a gate signal may be mounted on a flexible printed circuit film (not shown) that is attached on the insulation substrate 110 in a form of an integrated circuit chip, directly mounted on the insulation substrate 110, or integrated in the insulation substrate 110. When the gate driving circuit is integrated in the substrate 110, the gate line 121 may be extended to directly connect to the circuit.

A predetermined voltage may be applied to the storage electrode lines 131, which include a stem 133a extending substantially parallel to the gate lines 121, and a storage electrode 133b branched from the stem 133a. The stems 133a of the storage electrode lines 131 are positioned between two neighboring gate lines 121, and the stem 133a includes a protrusion overlapping an expansion of the drain electrode. However, the shape and disposition of the storage electrode lines 131 may vary from this example.

The gate lines 121 and the storage electrode lines 131 may be made of a conductor having low resistance such as aluminum-containing metals such as aluminum (Al) or an aluminum alloy, silver-containing metals such as silver (Ag) or a silver alloy, and copper-containing metals such as copper (Cu) or a copper alloy. The gate lines 121 and the storage electrode lines 131 may, however, have a multi-layered structure including two conductive layers (not shown) that have different physical properties. One conductive layer may be made of metals having low resistivity—for example, aluminum metals, silver metals, copper metals, and so on—in order to reduce a signal delay or a voltage drop. Conversely, the other conductive layer may be made of a material—such as a molybdenum metal, chromium, thallium, titanium, and so on—that has excellent physical, chemical, and electrical contact characteristics with other materials.

A gate insulating layer 140 that is made, for example, of silicon nitride (SiNx) or silicon oxide (SiOx), is formed on the gate lines 121 and the storage electrode lines 131. A semiconductor 151 made of a hydrogenated amorphous silicon is formed on the gate insulating layer 140. An ohmic contact 161 is formed on the semiconductor 151. The ohmic contact 161 may be made of a material such as n+ hydrogenated amorphous silicon in which an n-type impurity such as phosphorus is doped with high concentration, or of silicide.

A plurality of data lines 171 and a plurality of drain electrodes 175 are formed on the ohmic contact 161. The data lines 171 transfer a data signal and are mainly extended in a longitudinal direction, thereby intersecting the gate lines 121. Each data line 171 may overlap the storage electrode 133b. Each data line 171 includes a plurality of source electrodes 173 that are extended toward the gate electrode 124, and a wide data pad 179 for connecting to other layers or an external driving circuit.

A data driving circuit (not shown) that generates a data signal may be mounted on a flexible printed circuit film (not shown) that is attached on the substrate 110, directly mounted on the substrate 110, or integrated in the substrate 110. When the data driving circuit is integrated in the substrate 110, the data line 171 may be extended to directly connect to the circuit.

The drain electrode 175 is separated from the data line 171 and faces to the source electrode 173 with respect to the gate electrode 124. Each of the drain electrodes 175 includes an extension 177 as one end portion 177 having a wide area, and the other end portion having a bar shape. The extension 177 of the drain electrode overlaps the stem 133a of the storage electrode line, and the bar end portion is enclosed by the curved source electrode 173. The data wire includes the data line 171, the source electrode 173, the drain electrode 175, the extension 177, and the data pad 179. A protrusion (not shown) of the semiconductor 151 and a protrusion (not shown) of the ohmic contact 161 are exposed between the source electrode 173 and the drain electrode 175.

One gate electrode 124, one source electrode 173, one drain electrode 175, and the protrusion of the semiconductor 151 constitute one thin film transistor (TFT), and a channel of the thin film transistor is formed in the protrusion (not shown) between the source electrode 173 and the drain electrode 175.

The data line 171 and the drain electrode 175 may be made of a single layer of aluminum or an aluminum alloy, and may be made of a multi-layered structure of two or more layers. When forming the multi-layered structure of two or more layers, one layer may be made of a material having low resistance and the other layer may be made of a material having good contact characteristic with other materials. The ohmic contact 161 may exist only between the semiconductor 151 and the data line 171 and drain electrode 175, and may reduce contact resistance between them.

A passivation layer 180 (e.g., interlayer insulating layer) is formed on the data wires 171, 173, 175, 177, and 179. The passivation layer 180 has a first groove G1 exposing the data line 171, a second groove G2 exposing the gate line 121, a first contact hole C1 exposing the extension 177 of the drain electrode, a second contact hole C2 exposing the data pad 179, and a third contact hole C3 exposing the gate pad 129.

The passivation layer 180 includes a lower insulating layer 180a and an upper insulating layer 180b disposed on the lower insulating layer 180a. The lower insulating layer 180a may be made of an inorganic insulator such as silicon nitride or silicon oxide. The upper insulating layer 180b may be made of an organic insulator. Also, the upper insulating layer 180b may be made of an organic insulator having photosensitivity. The upper insulating layer 180b may have a function of a color filter.

Each width of the first groove G1, the second groove G2, the first contact hole C1, the second contact hole C2, and the third contact hole C3 on a portion passing through the lower insulating layer 180a is wider than each width of the first groove G1, the second groove G2, the first contact hole C1, the second contact hole C2, and the third contact hole C3 on the portion passing through the upper insulating layer 180b. Thus, the lower insulating layer 180a is undercut at the first groove G1, the second groove G2, the first contact hole C1, the second contact hole C2, and the third contact hole C3.

The side surface of the upper insulating layer 180b forming the first groove G1, the second groove G2, the first contact hole C1, the second contact hole C2, and the third contact hole C3 is approximately vertical. The side profile of the upper insulating layer 180b may be realized by using an organic layer having high thermal resistance.

The profile of the side surface of the upper insulating layer 180b is vertical such that a metal layer 300 filled in the first groove G1, the second groove G2, the first contact hole C1, the second contact hole C2, and the third contact hole C3 may be comparatively high with respect to the width thereof, which may be comparatively narrow. In another embodiment, the side surface of the upper insulating layer 180b may have a reverse taper in the first groove G1, the second groove G2, the first contact hole C1, the second contact hole C2, and the third contact hole C3.

A plurality of metal layers 300 are formed in the first groove G1, the second groove G2, the first contact hole C1, the second contact hole C2, and the third contact hole C3 on the data line 171, the gate line 121, the extension 177 of the drain electrode, the data pad 179, and the gate pad 129, respectively. The metal layers 300 may be made through electroless plating. The metal layers 300 may fill in the portions where the lower insulating layer 180a is undercut. The metal layers 300 may be made of a metal such as Ni, Co, Cu, Zn, Ag, Pt, and Pd.

An overcoat 250 may be disposed on the passivation layer 180 and the metal layers 300 may be formed on the data line 171, the gate line 121, and the extension 177 of the drain electrode. The overcoat 250 may have a function of planarizing the passivation layer 180 and the metal layer 300. The overcoat 250 may be made of an insulating layer having a low dielectric constant.

A plurality of pixel electrodes 191 and a plurality of contact assistants 81 and 82 are formed on the passivation layer 180. They may be made of a transparent conductive material such as ITO or IZO, or a reflective metal such as aluminum, silver, or alloys thereof.

The pixel electrodes 191 are physically and electrically connected to the extension 177 of the drain electrodes 175 through the metal layer 300 filled in the first contact hole C1, and receive a data voltage from the drain electrodes 175. The pixel electrodes 191 to which a data voltage is applied and a common electrode (not shown) of the other display panel (not shown) that receives a common voltage generate an electric field, thereby determining a direction of liquid crystal molecules of a liquid crystal layer (not shown) between the two electrodes. As the pixel electrodes 191 and the common electrode form a capacitor (hereinafter referred to as a "liquid crystal capacitor"), an applied voltage is sustained even after a thin film transistor is turned off.

The pixel electrodes 191 overlap the storage electrode lines 131 including the storage electrodes 133b. A capacitor that is formed as a pixel electrode 191 and a drain electrode 175 that is electrically connected thereto and overlapped with a storage electrode line 131 is called a storage capacitor, and the storage capacitor enhances the voltage sustaining ability of a liquid crystal capacitor.

The contact assistants 82 and 81 are connected, respectively, to the data pad 179 and the gate pad 129 through the metal layer 300 filling the second and third contact holes C2 and C3. The contact assistants 82 and 81 compensate adhesion between the data pad 179 and the gate pad 129 and an external apparatus, and protect them.

Figure 10:
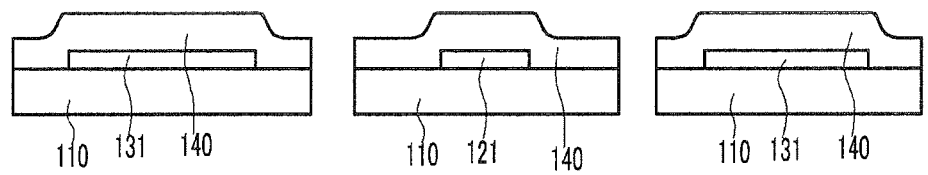
FIGS. 10, 12, 14, 16 and 18 are cross-sectional views taken along the lines VIII-VIII', VIII'-VII'', and VIII''-VIII''' shown in FIG. 7 illustrating a method, according to one or more embodiments, for manufacturing the thin film transistor array panel shown in FIG. 7 to FIG. 9.
Figure 11:
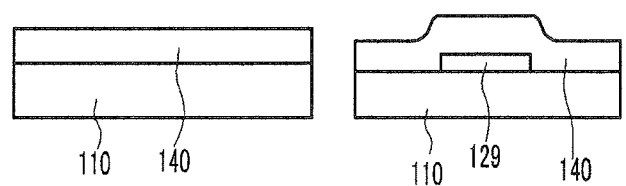
FIGS. 11, 13, 15, 17 and 19 are cross-sectional views taken along the lines IX-IX' and IX'-IX" shown in FIG. 7 illustrating a method, according to one or more embodiments, for manufacturing the thin film transistor array panel shown in FIG. 7 to FIG. 9.

FIG. 10 to FIG. 19 are cross-sectional views for explaining a method, according to one or more embodiments, of manufacturing the thin film transistor array panel shown in FIG. 7 to FIG. 9. Referring to FIG. 7, FIG. 10, and FIG. 11, a conductive layer is formed on an insulation substrate 110 and patterned through a photolithography process to form a plurality of gate lines 121 including gate electrodes 124 and gate pads 129, and a plurality of storage electrode lines 131 including stems 133a and storage electrodes 133b. A gate insulating layer 140 made, for example, of silicon nitride or silicon oxide is formed on the gate lines 121 and the storage electrode lines 131.

Figure 12:
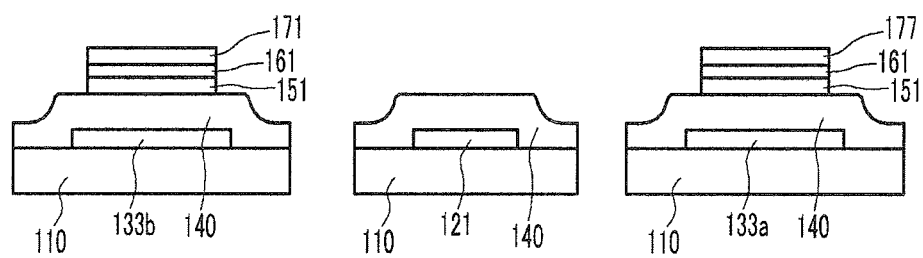
Figure 13:
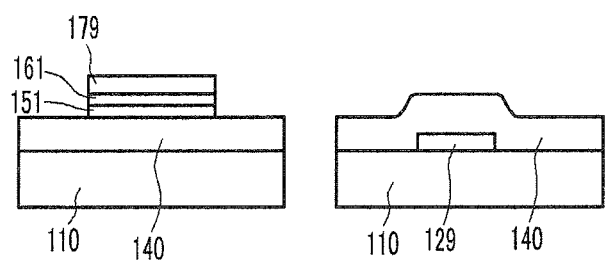

Referring to FIG. 7, FIG. 12, and FIG. 13, a semiconductor layer 151 made of a semiconductor such as an amorphous silicon is formed on the gate insulating layer 140, and an ohmic contact layer 161 made of a material such as n+ hydrogenated amorphous silicon that is doped with an n-type impurity at a high concentration or silicide, and a data wire layer are formed on the semiconductor layer 151.

Three layers including the semiconductor layer 151, the ohmic contact layer 161, and the data wire layer are simultaneously patterned using a photolithography process. A data wire including a data line 171, a source electrode 173 connected to the data line 171 and neighboring to the gate electrode 124, a drain electrode 175 facing the source electrode 173 with respect to the gate electrode 124, the extension 177 of the drain electrode and a data pad 179 connected to one end of the data line 171 are formed. Also, an ohmic contact layer 161 having substantially the same plane shape as the data wires 171, 173, 175, and 179 is formed, and a semiconductor layer 151 having substantially the same plane shape as the data wires 171, 173, 175, and 179 except for a channel between the source electrode 173 and the drain electrode 175 is formed. The process in which the semiconductor layer 151, the ohmic contact layer 161, and the data wires are simultaneously patterned may be executed by using a half-tone mask including a transparent region, a semi-transparent region, and a light blocking region.

Figure 14:
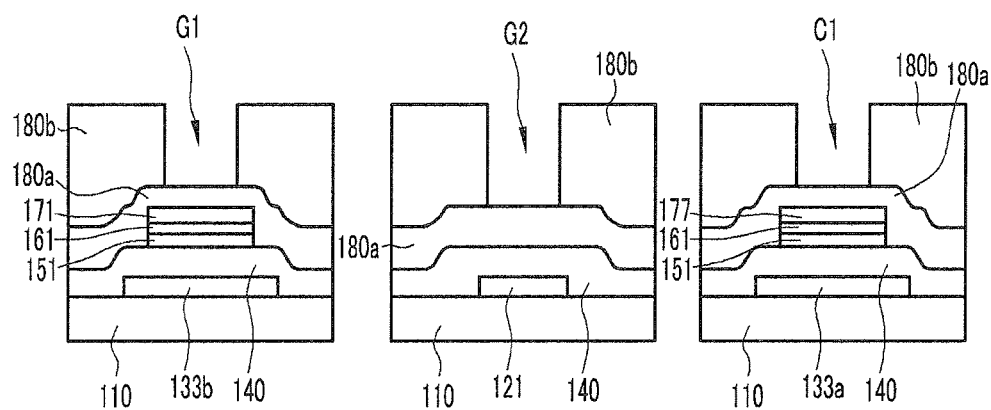
Figure 15:
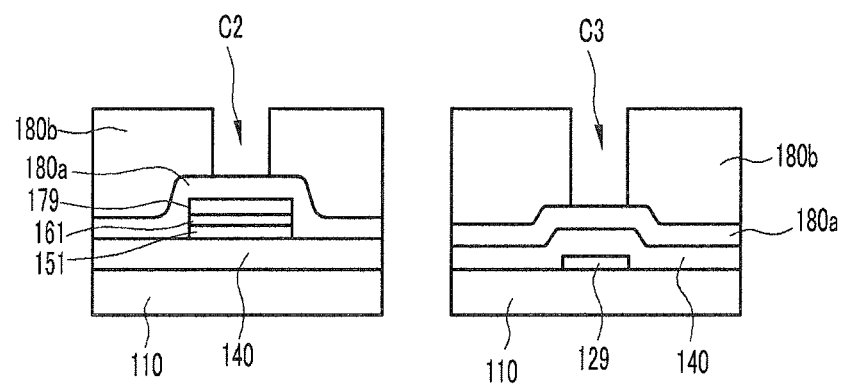

Referring to FIG. 7, FIG. 14, and FIG. 15, a passivation layer 180 is formed on the data wires 171, 173, 175, and 179. The passivation layer 180 is formed by sequentially depositing a lower insulating layer 180a and an upper insulating layer 180b on the lower insulating layer 180a. The upper insulating layer 180b is patterned through a photo-process. The first primary groove G1, the second primary groove G2, the first primary contact hole C1, the second primary contact hole C2, and the third primary contact hole C3 exposing the lower insulating layer 180a are formed. Each side wall of the first primary groove G1, the second primary groove G2, the first primary contact hole C1, the second primary contact hole C2, and the third primary contact hole C3 may be formed to be approximately perpendicular with respect to the insulation substrate 110, e.g., a top surface of insulation substrate 110.

Figure 16:
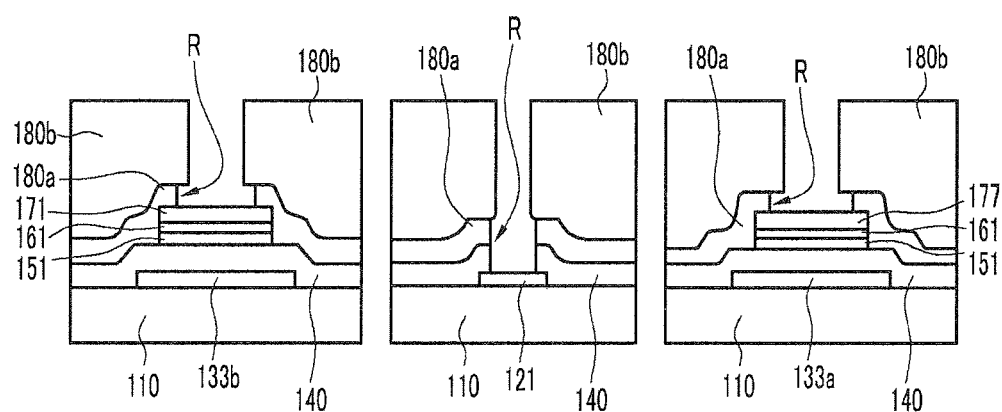
Figure 17:
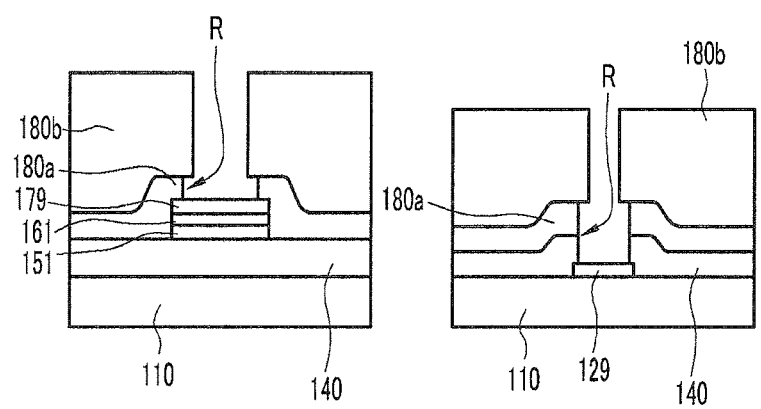

Referring to FIG. 7, FIG. 16, and FIG. 17, the lower insulating layer 180a is etched by using the upper insulating layer 180b as a mask. The first groove exposing the data line 171, the second groove exposing the gate line 121, the first contact hole exposing the extension 177 of the drain electrode, the second contact hole exposing the data pad 179, and the third contact hole exposing the gate pad 129 are formed together.

Each of the first groove, the second groove, the first contact hole, the second contact hole, and the third contact hole at the portion passing through the lower insulating layer 180a may be wider than each of the first groove, the second groove, the first contact hole, the second contact hole, and the third contact hole at the portion passing through the upper insulating layer 180a. That is, the first groove, the second groove, the first contact hole, the second contact hole, and the third contact hole may include the portion R where the lower insulating layer 180a is undercut under the upper insulating layer 180b.

Figure 18:
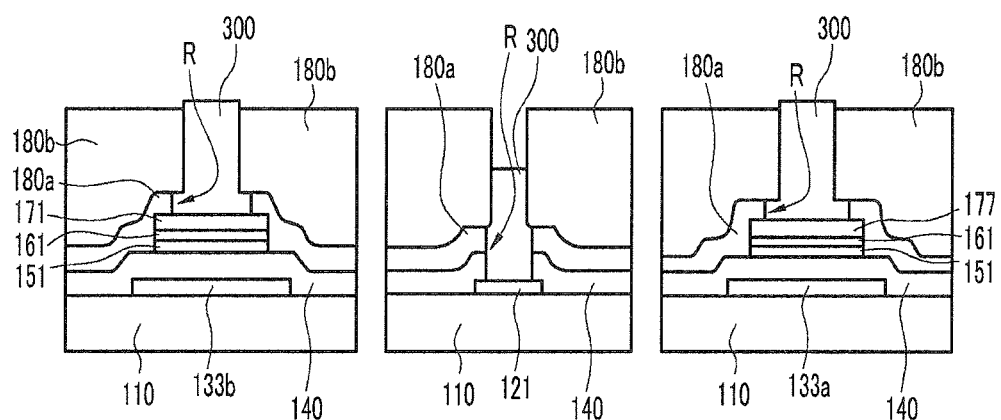
Figure 19:
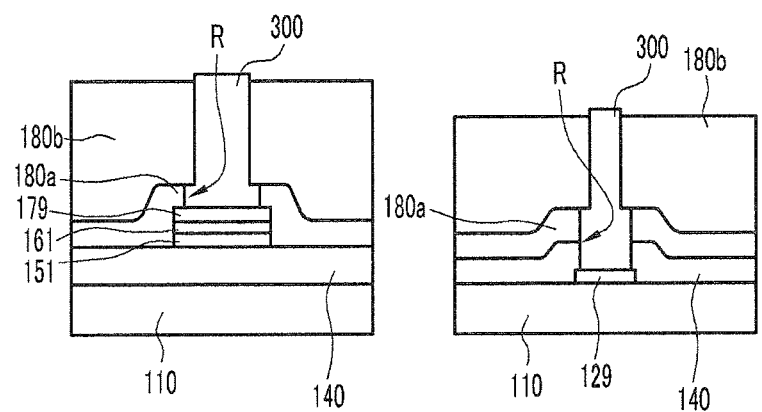

Referring to FIG. 7, FIG. 18, and FIG. 19, a plurality of metal layers 300 are respectively formed inside the first groove, the second groove, the first contact hole, the second contact hole, and the third contact hole on the data line 171, the gate line 121, the extension of the drain electrode 177, the data pad 179, and the gate pad 129. The metal layers 300 may be formed through electroless plating. The metal layers 300 may fill in the portions R where the lower insulating layer 180a is undercut. The metal layers 300 may completely fill in the first groove, the second groove, the first contact hole, the second contact hole, and the third contact hole, or a portion thereof. Although not shown, a thermal reflow process may be executed for the upper insulating layer 180b to reduce defects due to the undercut of the lower insulating layer 180a before forming the metal layers 300 by using electroless plating.

A passivation layer 180 on the data line 171, the gate line 121, and the extension 177 of the drain electrode and an overcoat 250 on the metal layers 300 are formed, and a plurality of pixel electrodes 191 and a plurality of contact assistants 81 and 82 are formed on the passivation layer 180 to complete the thin film transistor array panel shown in FIG. 8 and FIG. 9.

While embodiments of this invention have been described in connection with what are presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. A method for manufacturing a contact portion of wiring, the method comprising:
    forming a conductive layer on a substrate;
    sequentially forming a lower insulating layer and an upper insulating layer on the conductive layer;
    patterning the upper insulating layer to form a primary contact hole exposing the lower insulating layer;
    etching the lower insulating layer by using the patterned upper insulating layer as a mask to form a contact hole exposing the conductive layer;
    selectively forming a metal layer to fill the contact hole through electroless plating in a state that a width of the contact hole in the upper insulating layer is smaller than that of the contact hole of the lower insulating layer; and
    forming a transparent electrode connected to the metal layer on the upper insulating layer,
    wherein the selectively forming the metal layer includes forming the metal layer having a thickness thicker than that of the lower insulating layer, and
    wherein the forming the metal layer inside the contact hole through electroless plating includes filling the contact hole having an undercut under the upper insulating layer with the metal layer.

2. The method of claim 1, wherein the upper insulating layer is made of a photosensitive organic insulator and the lower insulating layer is made of an inorganic insulator.

3. The method of claim 2, wherein a side wall of the primary contact hole is approximately perpendicular to the surface of the substrate in the forming of the primary contact hole.

4. A method for manufacturing a thin film transistor array panel, the method comprising:
    forming a gate wire including a gate line, a gate electrode connected to the gate line, and a gate pad connected to one end of the gate line on a substrate;
    forming a gate insulating layer on the gate wire;
    forming a semiconductor layer on the gate insulating layer;
    forming a data wire intersecting and insulated from the gate line and including a data line, a source electrode connected to the data line and neighboring the gate electrode, a drain electrode facing the source electrode with respect to the gate electrode, and a data pad connected to one end of the data line;
    sequentially forming a lower insulating layer and an upper insulating layer on the data wire;
    patterning the upper insulating layer to form a first primary contact hole exposing the lower insulating layer;
    etching the lower insulating layer by using the patterned upper insulating layer as a mask to form a first contact hole exposing the drain electrode;
    selectively forming a first metal layer inside the first contact hole through electroless plating in a state that a width of the first contact hole in the upper insulating layer is smaller than that of the first contact hole of the lower insulating layer; and
    forming a pixel electrode on the upper insulating layer and connected to the first metal layer,
    wherein the forming the first metal layer inside the first contact hole includes forming the first metal layer having an upper surface of the first metal layer inside the first contact hole is higher-than an upper surface of the lower insulating layer, and
    wherein the forming the first metal inside the first contact hole through electroless plating includes filling the first contact hole having an undercut under the upper insulating layer with the first metal layer.

5. The method of claim 4, wherein the upper insulating layer is made of a photosensitive organic insulator and the lower insulating layer is made of an inorganic insulator.

6. The method of claim 5, wherein the upper insulating layer is a color filter.

7. The method of claim 6, wherein the side wall of the first primary contact hole is approximately perpendicular to the surface of the substrate in the forming of the first primary contact hole.

8. The method of claim 4, wherein:
a second primary contact hole and a third primary contact hole are formed in the upper insulating layer together with the forming of the first primary contact hole, and
a second contact hole passing through the lower insulating layer and the gate insulating layer and exposing the gate pad and a third contact hole passing through the lower insulating layer and exposing the data pad are formed together with the forming of the first contact hole.

9. The method of claim 8, wherein a second metal layer and a third metal layer are respectively formed inside the second contact hole and the third contact hole together with the forming of the first metal layer.

10. The method of claim 4, wherein:
a first primary groove and a second primary groove are formed in the upper insulating layer along with the forming of the first primary contact hole, and
a first groove and a second groove respectively exposing an upper surface of the gate line and an upper surface of the data line are formed along with the forming of the first contact hole.

11. The method of claim 10, wherein a fourth metal layer contacting the gate line inside the first groove and a fifth metal layer contacting the data line inside the second groove are formed along with the forming of the first metal layer.

12. The method of claim 4, wherein:
the forming the first metal layer inside the contact hole through electroless plating includes filling the first contact hole having an undercut under the upper insulating layer with the first metal.

13. The method of claim 12, wherein the upper insulating layer is a color filter.

14. The method of claim 13, wherein a side wall of the first primary contact hole is approximately perpendicular to the surface of the substrate in the forming of the first primary contact hole.

15. The method of claim 12, wherein the side wall of the first primary contact hole is approximately perpendicular to the surface of the substrate in the forming of the first primary contact hole.

16. The method of claim 4, wherein the upper insulating layer is a color filter.

17. The method of claim 16, wherein the side wall of the first primary contact hole is approximately perpendicular to the surface of the substrate in the forming of the first primary contact hole.

18. The method of claim 4, wherein the side wall of the first primary contact hole is approximately perpendicular to the surface of the substrate in the forming of the first primary contact hole.

* * * * *